(12) United States Patent
St. Amand et al.

(10) Patent No.: US 7,755,176 B1
(45) Date of Patent: Jul. 13, 2010

(54) DIE-MOUNTING SUBSTRATE AND METHOD INCORPORATING DUMMY TRACES FOR IMPROVING MOUNTING FILM PLANARITY

(75) Inventors: Roger D. St. Amand, Tempe, AZ (US); Chang Suk Han, Sungnam (KR); Alexander W. Copia, Chandler, AZ (US); Wan Wook Ko, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 400 days.

(21) Appl. No.: 11/111,316

(22) Filed: Apr. 21, 2005

(51) Int. Cl.
*H01L 23/02* (2006.01)

(52) U.S. Cl. .................. 257/678; 257/690; 257/696; 257/734; 257/730; 257/786; 257/E23.023

(58) Field of Classification Search .......... 257/690, 257/678, 696, 734, 730, 786, E23.023
See application file for complete search history.

(56) References Cited

U.S. PATENT DOCUMENTS 6,198,165 B1 * 3/2001 Yamaji et al. .......... 257/734

2003/0040143 A1 * 2/2003 Chien et al. ............ 438/125
2004/0065473 A1 * 4/2004 Chang et al. ........... 174/261

* cited by examiner

*Primary Examiner*—Lynne A Gurley
*Assistant Examiner*—Junghwa M Im
(74) *Attorney, Agent, or Firm*—Gunnison, McKay & Hodgson, L.L.P.; Serge J. Hodgson

(57) ABSTRACT

A die-mounting substrate and method incorporating dummy traces for improving mounting film planarity makes the use of film attach possible with a simplified manufacturing process and in applications where film-attach was not previously practical. The die-mounting substrate includes dummy traces that are generated along with signal traces extending into the die mounting area of the substrate. The dummy traces are designed according to the same design rules as the signal traces and are disposed in otherwise empty regions between signal traces and vias within the die mounting area. The result is die mounting area without regions empty of signal traces that previously either lack conductor or are filled completely with conductor, either of which will result in surface variation that compromises the film bond.

15 Claims, 9 Drawing Sheets

DIE-MOUNTING SUBSTRATE AND METHOD INCORPORATING DUMMY TRACES FOR IMPROVING MOUNTING FILM PLANARITY

FIELD OF THE INVENTION

The present invention relates generally to integrated circuit packaging and more specifically, to a Method and substrate having improved die film-attach characteristics.

BACKGROUND OF THE INVENTION

Due to the increasing limitation of wafer-scale integration, in terms of cycle time and technology integration, significant advancements are being made in the area of multi-die packaging (e.g.: stacked-die package). Additionally, there is pressure from the semiconductor industry to reduce overall package size requirements that encompass both footprint area and package height. The package-height constraint results in thinner and thinner dies being stacked in a single package. However, there are limitations in the ability to stack dies of numerous sizes, shapes, and thickness in the desired configurations.

Currently, paste and elastomeric film adhesives are used to attach semiconductor die to the laminated substrate. The benefit of paste adhesives is that during the assembly process, the paste has viscous properties that accommodate irregular topographical features on the substrate and minimize the formation of die attach voids.

However, there are disadvantages to using paste adhesive. In particular, thin dies often have significant warpage. During the die attach process, the pick & place tool will hold the die substantially flat while the die is in contact with the paste. However, due to the viscous nature of paste adhesives, when the pressure from the pick & place tool is removed, the die will have a strong tendency to return to a warped shape. The result is undesirable non-uniform bond line thickness, which makes subsequent processing steps, such as wirebonding or die stacking, more difficult. Die attach paste also has a tendency to shrink during the curing process and the shrinkage may produce a reverse fillet that extends under the edge of the die rather than upward along the side walls of the die.

Film adhesives have the advantage of providing a uniform bond line thickness and do not shrink appreciably during the curing process. However, due to the rather rigid nature of film adhesives, topographical features on the substrate surface tend to cause interfacial voids between the bottom of the film adhesive and the surface of the substrate. The formation of such voids is undesirable, both from an assembly yield and reliability perspective. The presence of interfacial voids results in less than optimal adhesion and can trap moisture that expands and causes de-lamination during post-assembly temperature excursions. The voids are caused by the shapes of the surface variations themselves and by air that is trapped due to feature patterns that provide no exit for air during die mounting.

One method used to minimize topographical variations of the substrate is a fill of all areas around electrical traces with solid metal. However, solid regions of metal tend to be thicker that the metal traces due to etching/plating density, resulting in less than ideal planarity. Further, it is very important that the top solder mask layer and the underlying prepreg layer on either side of the top metal layer have sufficient contact to provide adhesion.

An alternative method of providing a substantially flat surface for attaching via film adhesive is planarizing the substrate, using a filler material and a mechanical grinding technique, prior to applying the top layer of solder mask. The disadvantage of mechanical planarization is a lack of technology available for high-volume manufacturing. Due to the need to incorporate filler material and due to the cost of the additional processing, it will likely be some time before the technique becomes a viable option and the industry fully adopts the technique.

Therefore, it would be desirable to provide a low cost and low processing overhead method and substrate for film-mounting semiconductor dies that overcomes problems associated with film-mounting a die over conductive pattern features on the surface of the substrate.

SUMMARY OF THE INVENTION

The above stated objectives are achieved in a method and substrate for film-mounting a semiconductor die. The substrate includes a plurality of dummy traces designed according to the same design rules as signal traces, with both the dummy traces and the signal traces disposed within a die mounting area. The dummy traces act as a fill pattern within regions empty of signal traces and vias, and any other functional conductive pattern features disposed within the die mounting area.

The presence of the dummy traces improves the planarity of the die mounting area of the substrate by filling the otherwise empty regions with a pattern consistent with the signal trace pattern, thus overcoming irregularities of either empty regions or regions completely filled with metal, either of which will adversely affect the planarity of the substrate in the die mounting area. The dummy traces are also disposed so that channels between the dummy traces and/or signal traces provide a path for air to exit from under the die during tape mounting.

A solder mask may be applied to the substrate over the signal traces and dummy traces, with the surface variations of the signal traces and dummy traces producing a corresponding variation of the outer surface of the solder mask so that channels are provided for the exit of air from under the die.

The substrate is then incorporated in a semiconductor package that includes an adhesive film that attaches a die to the substrate over the die mounting area.

BRIEF DESCRIPTION OF THE DRAWINGS

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

Figure 1:
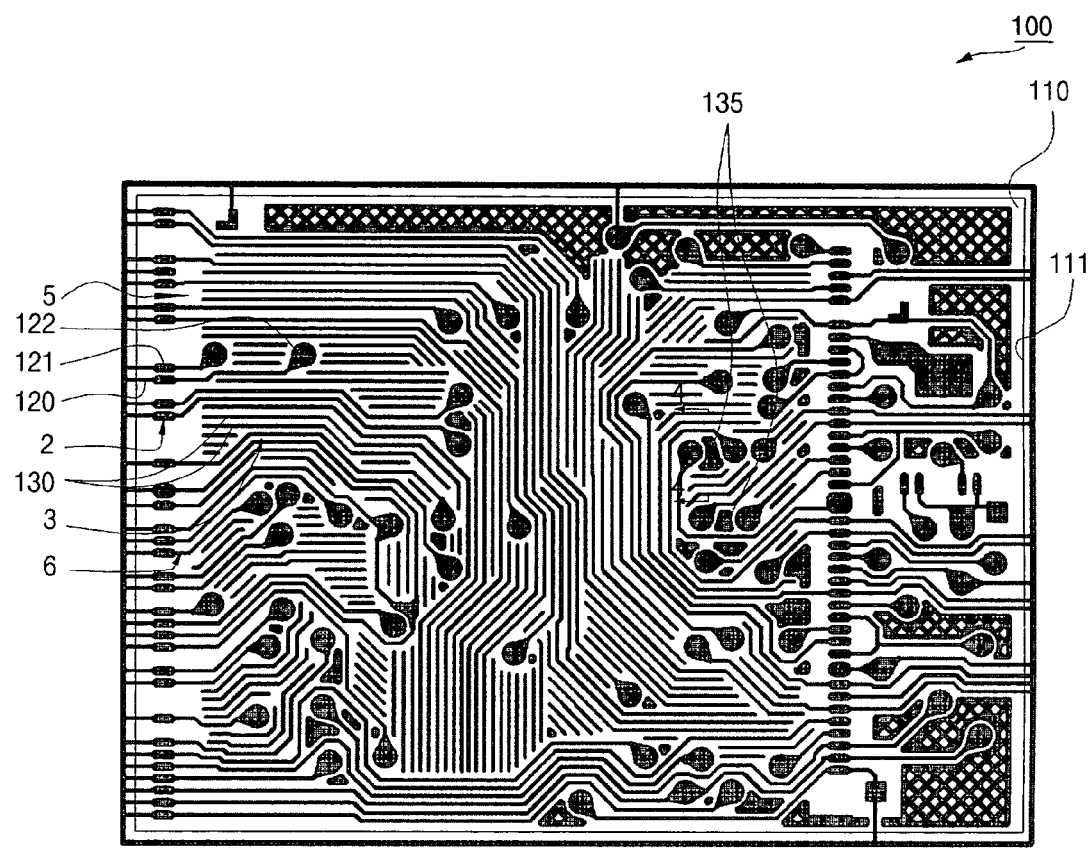
FIG. 1 is a plan view of a substrate according to an embodiment of the present invention.

FIG. 1 is a plan view of a substrate 100 according to an embodiment of the present invention. Substrate 100 includes an insulating layer 110, a plurality of signal traces 120, and a plurality of dummy traces 130, formed on insulating layer 110. Signal traces 120 and dummy traces 130 have prescribed width, spacing and length, according to design rules. Surfaces of signal traces 120, dummy traces 130, and a non-trace portion of insulating layer 110 are coated with a solder mask (not shown). Insulating layer 110 is shown as a substantially rectangular thin planar plate, having four sides and four corners and may be square in shape. Insulating layer 110 may be formed of typical insulating film, insulating tape, thermosetting resin, prepreg material, or their equivalents, and the material for insulating layer 110 is not limited with respect to the present invention.

Each of signal traces 120 has a bond finger 121 formed at a portion thereof which is located at a region nearer to the side edge of insulating layer 110. Bond finger 121 has a width larger than the other portion of signal trace 120 (excepting any vias) and serves as the portion to which a die-connect wire is bonded in the manufacturing process of the semiconductor package. The surface of the bond finger 121 may be plated with gold, silver, palladium, nickel, or an equivalent, in order to enhance the adhesion strength and reliability of the bond between the bond finger and the wire. Bond finger 121 is not coated with solder mask, so that solder mask does not have to be removed from bond finger 121 during or prior to bonding. Signal trace 120 may include a circular via pad 122, formed at a distance apart from bond finger 121, and which is wider than other portions of signal trace 120.

Dummy traces 130 are formed in the otherwise empty regions between signal traces 120. Dummy traces 130 define channels, which enable air to travel from the central portion of insulating layer 110 to the edge thereof, without being trapped during the adhesion process of the semiconductor die. The channels are normally present between signal trace 120 and adjacent signal traces 120, and in the present invention, the channel spacing and width are maintained across the die mounting area by dummy traces 130, and extend toward the side edges or the corners of insulating layer 110. Additionally, dummy traces 130, by filling open areas in the design, yield a more uniform mounting surface that promotes adhesion and minimizes the formation of interfacial voids during the adhesion process.

Dummy traces 130, as described above, have the same width and spacing as those of signal traces 120, so that dummy traces 130 can be formed by the same design rules for signal traces 120. For example, when signal trace 120 has a width of 40–80 um, dummy trace 130 also has a width of 40–80 um. Further, the spacing between signal trace 120 and a dummy trace 130 adjacent to signal trace 120, and the spacing between dummy traces 130 is equal to the minimum spacing between signal trace 120 and another signal trace 120. For example, if the minimum spacing between signal trace 120 and an adjacent signal trace 120 is 40 um, the spacing between dummy trace 130 and the next dummy trace 130 should also be 40 um. Further, a solid region 135 having a predetermined area may be formed between two adjacent signal traces 120, between signal trace 120 and dummy trace 130, and/or between two adjacent dummy traces 130. However, it is preferred that solid region 135 has an area as small as possible. For example, solid regions may be formed by combining dummy traces that have lengths that are less than 5 times the minimum width of signal traces 120. Traces having widths less than 30 um and greater than 80 um are also contemplated by the present invention. However, at the time of this application, normal trace widths range from 40 um to 80 um.

Reference numeral 111 denotes a line along which punch singulation or saw singulation is performed during the manufacture of a semiconductor package that includes substrate 100.

Several selected regions of substrate 100, detailing specific features of the present invention, will be described below. However, the particular regions selected and their associated description are not limitations of the present invention, but are intended to be exemplary only. The present invention is directed in general toward an arrangement of signal traces 120 and dummy traces 130 for minimizing formation of non-patterned regions between signal traces 120, and may be implemented in various forms. The arrangement of traces in accordance with embodiments of the present invention serves to minimize any topographical features on the substrate surface that will tend to cause interfacial voids between the bottom of a film adhesive that is used to attach a die, and the surface of the substrate.

Figure 2:
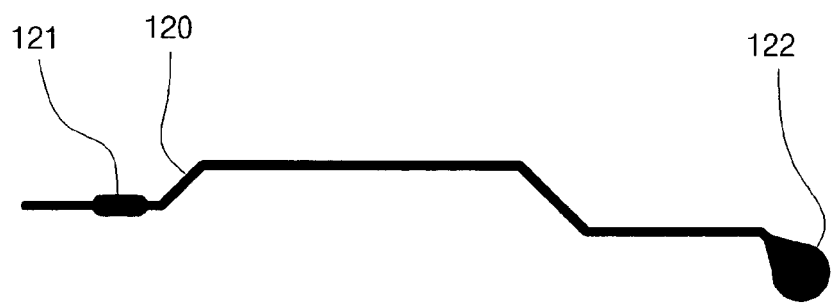
FIG. 2 is an enlarged plan view of region 2 of FIG. 1.

FIG. 2 shows details of region 2 of FIG. 1. Specifically, FIG. 2 is a plan view showing an illustrative signal trace 120 of substrate 100 according to an embodiment of the present invention. As shown, signal trace 120 has a bond finger 121 formed at one end and a via pad 122 formed at the other end of signal trace 120. Bond finger 121 is wider than the connecting portion of signal trace 120 and via pad 122 is wider than the bond finger 121. Further, signal trace 120 may be bent at least once at an obtuse angle, i.e., an angle between 90° and 180°.

Figure 3:
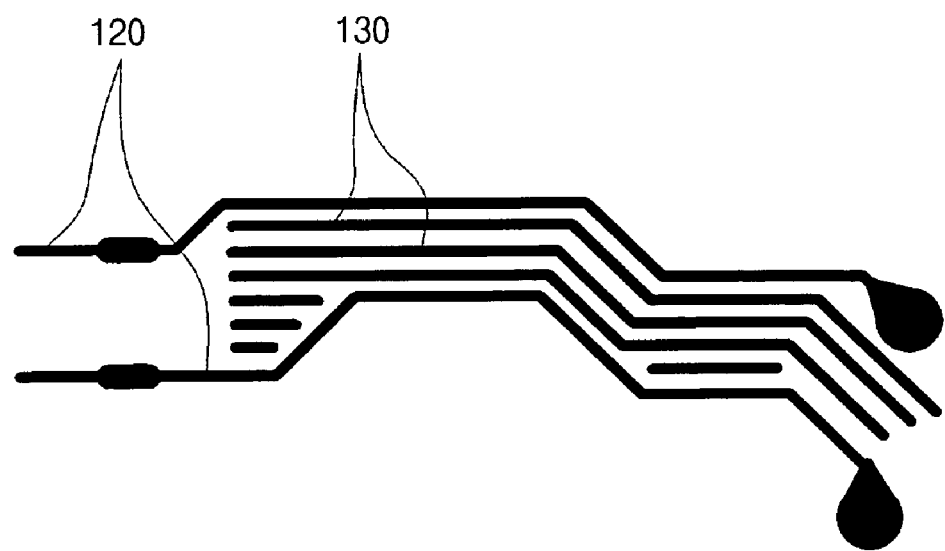
FIG. 3 is an enlarged plan view of region 3 in FIG. 1.

FIG. 3 shows region 3 of FIG. 1. Specifically, FIG. 3 is a plan view showing illustrative dummy traces 130 formed adjacent to signal trace 120 of substrate 100, according to an embodiment of the present invention. As shown, a plurality of dummy traces 130 are formed adjacent to signal trace 120, i.e., in the otherwise region between and defined by the extension of signal traces 120, including any vias. Each of dummy traces 130 has a shape similar to that of signal trace 120. For example, each of dummy traces 130 may be bent at least once in parallel to signal trace 120, so that dummy traces 130 follow a curvilinear or segmented linear path along and between signal traces 120. Further, signal trace 120 and dummy trace 130 have substantially the same width. For example, a same width between 40 and 80 um. Further, the spacing between adjacent traces (dummy traces 130 and/or signal traces 120) may be substantially the same. For example, all of the inter-conductor spacings may be a same value between 40 and 80 um. However the use of smaller lines and spaces (<40 um) are also contemplated and using these smaller dimensions generally results in a more planar substrate surface and therefore more desirable properties for film-adhesion. However, in certain instances, cost and/or yield may prohibit the use of fine lines and spaces.

By incorporating dummy traces 130, the present invention provides for an interface between the film adhesive on the backside on the semiconductor die and the substrate surface that is substantially void free. Further, an improved adhesion force between the film adhesive on the backside of the semiconductor die and the substrate is established while using the current design and processing techniques of substrate 100.

Figure 4:
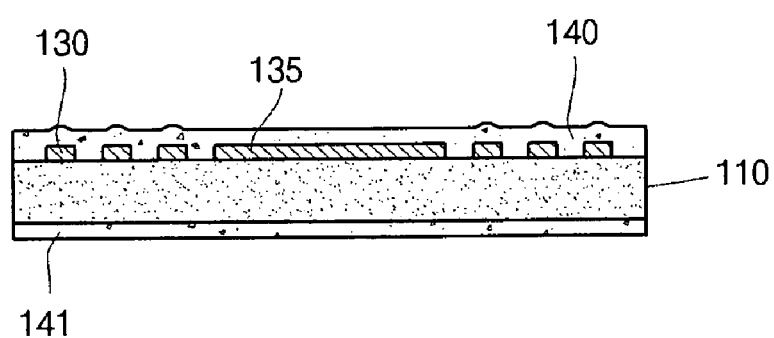
FIG. 4 is a sectional view of the substrate of FIG. 1 as taken across line 4-4.

As shown in FIG. 4, a solid region 135 may be formed to fill small open regions. For example, when a small group of dummy traces 130 have lengths less than 5 times the minimum width of signal traces 120, these dummy traces may be combined to form a solid region of metal. This will reduce the possibility of dummy traces lifting during substrate processing operations. Solid region 135 has a width larger than the width of dummy trace 130. However, when solid region 135 has too large an area, the adhesion between the solder mask 140 and insulating layer 110 may be reduced to an unacceptable level. Therefore, formation of solid regions 135 is restricted to particular conditions, an example of which is provided in the above description. In the drawings, reference numeral 141 is a solder mask coated at the bottom surface of insulating layer 110.

Figure 5:
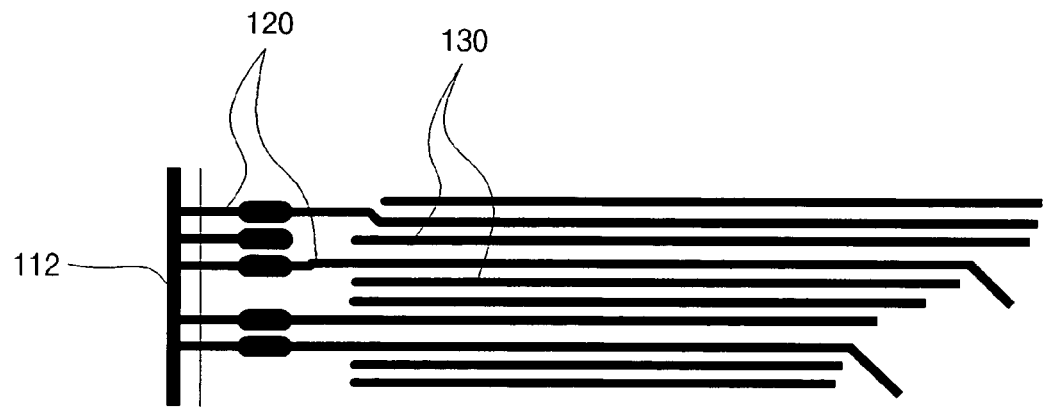
FIG. 5 is an enlarged plan view of region 5 in FIG. 1.

FIG. 5 shows details of region 5 in FIG. 1. Specifically, FIG. 5 is a plan view showing other illustrative dummy traces 130 extending perpendicularly to the side edge 112 of insulating layer of the substrate 100 according to an embodiment of the present invention.

As shown, dummy traces 130 may be formed to extend perpendicularly to the side edge 112 of insulating layer. Therefore, channels formed between dummy traces 130 also extend perpendicularly to the side edge 112 of insulating layer, allowing air that would be trapped by a more closed structure to escape toward the edge of insulating layer 110.

Figure 6:
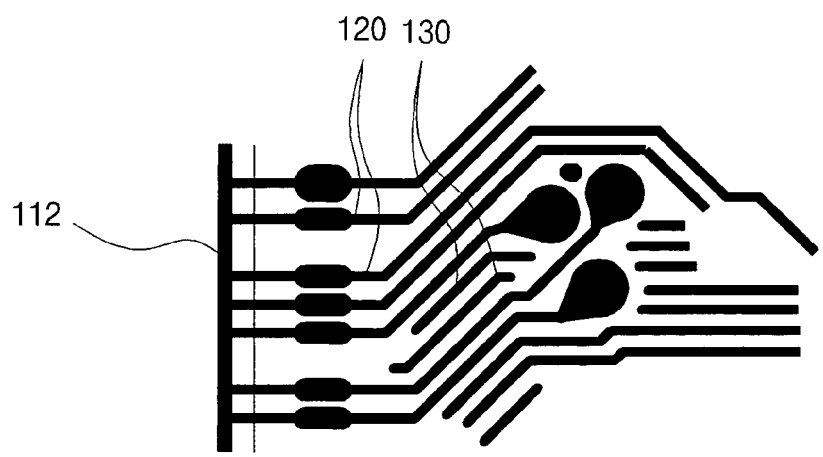
FIG. 6 is an enlarged plan view of region 6 in FIG. 1.

FIG. 6 shows details of region 6 in FIG. 1. Specifically, FIG. 6 is a plan view showing other illustrative dummy traces 130 extending at an angle with respect to the side edge 112 of insulating layer of substrate 100, in accordance with an embodiment of the present invention.

As shown, dummy traces 130 may be formed to extend at an angle with respect to the side edge 112 of insulating layer. Therefore, channels formed between dummy traces 130 also extend at an angle with respect to the side edge 112 of insulating layer, thereby allowing air, which may be otherwise trapped in a central portion thereof, to easily escape toward the edge of insulating layer 110.

It should be appreciated that signal traces 120 and dummy traces 130 patterned as described in the detail drawings above are only representative selected examples and may be modified into various types and shapes within the scope of the present invention. The main purpose of the dummy trace fill design in conjunction with film die attach adhesive is to provide a uniform, substantially flat surface to minimize the formation of interfacial voids that could otherwise occur due to trapped air, and to provide channels for air to escape from under the die at the die edge.

Figure 7:
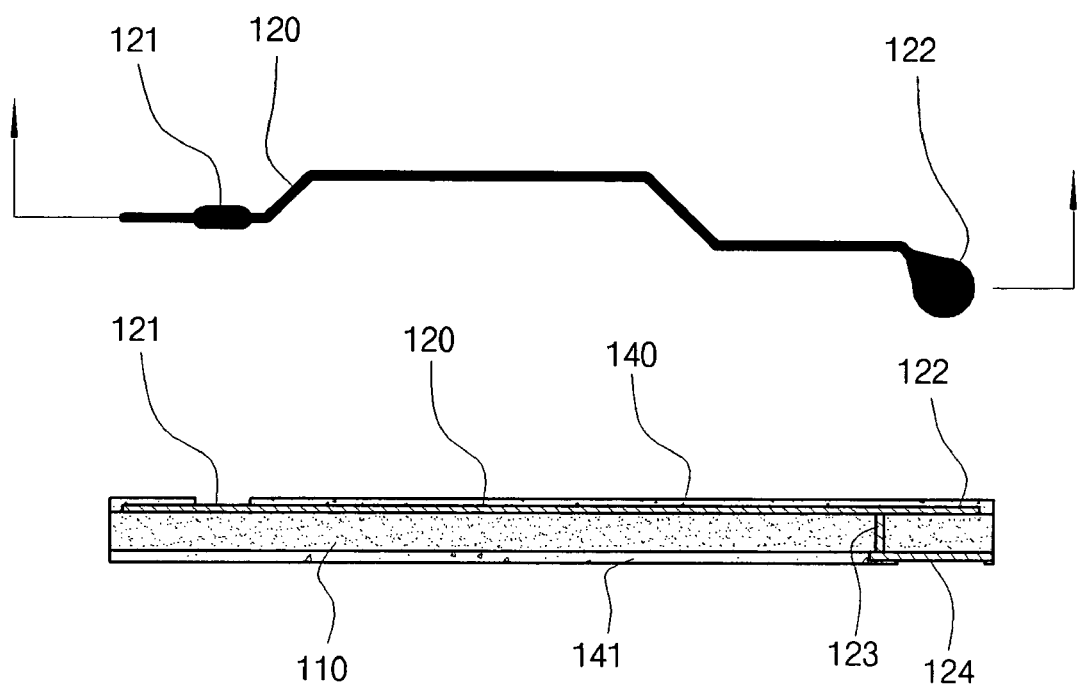
FIG. 7 is a longitudinal sectional view of a signal trace in a substrate according to an embodiment of the present invention.

FIG. 7 is a longitudinal cross section view of a signal trace 120 in substrate 100 according to an embodiment of the present invention. As shown, signal trace 120 is formed with a predetermined thickness on the surface of insulating layer 110 and has a bond finger 121 formed at one end thereof and a via pad 122 formed at the other end thereof. Further, a solder mask 140 is applied with a predetermined thickness covering signal trace 120. Bond finger 121 of signal trace 120 is exposed to the upper exterior through the solder mask 140. Therefore, a conductive wire may be bonded to the bond finger 121. A ball land 124 may also be formed on the bottom surface of insulating layer 110. Ball land 124 is electrically connected to via pad 122 of signal trace 120 through conductive via 123. Conductive via 123 penetrates insulating layer 110 to provide electrical connection between signal trace 120 and ball land 124. A solder mask 141 is applied with a predetermined thickness on the bottom surface of insulating layer 110 and ball land 124 of insulating layer 110 is exposed to the lower exterior through solder mask 141. Thereafter, a solder ball may be reflowed to the ball land 124.

Although a multi-layer structure is not shown in the drawings, the present invention can be applied to a circuit substrate having one or more conductive layers. In such a circuit, dummy traces 130 will occupy the layer(s) of the substrate to which a semiconductor die is attached.

Figure 8:
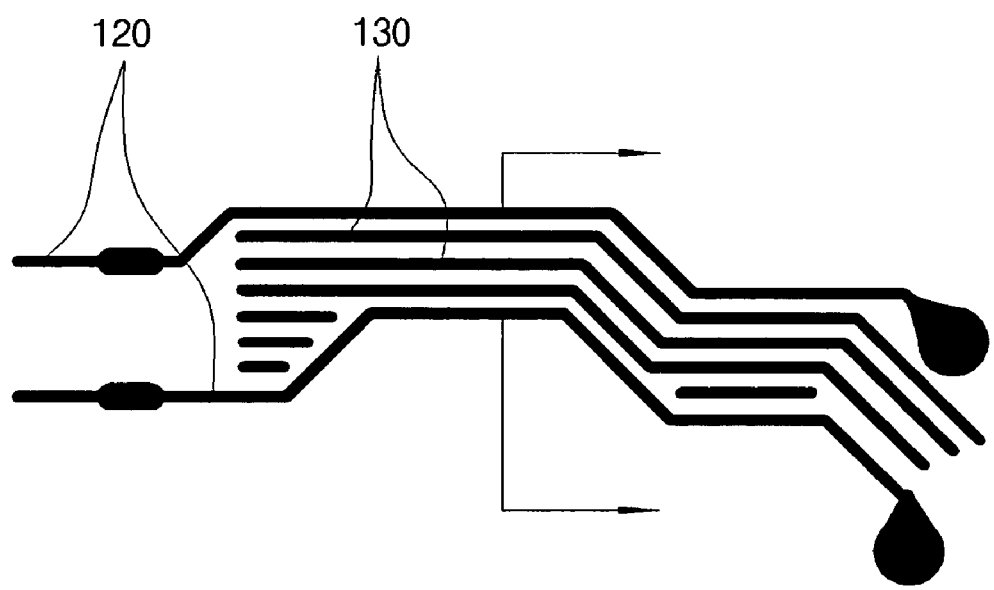
FIG. 8 is a transverse cross-section view of signal traces and dummy traces according to an embodiment of the present invention.
Figure 8:
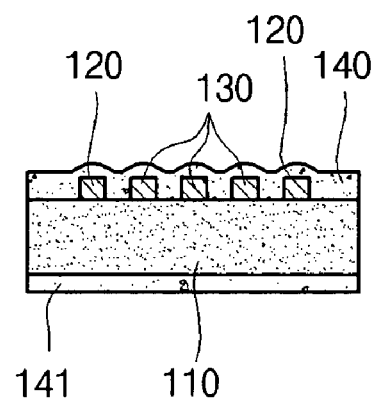

FIG. 8 is a transverse sectional view of signal traces 120 and dummy traces 130 in the substrate 100 according to an embodiment of the present invention.

As shown, signal traces 120 and dummy traces 130, having a predetermined width and a predetermined spacing, are formed on the surface of insulating layer 110. A solder mask 140 is applied with predetermined thickness to cover the surfaces of insulating layer 110, signal traces 120 and dummy traces 130. The surface of the solder mask 140 has a surface, which is lowest on the surface of insulating layer 110 and highest on the surface of signal traces 120 and dummy traces 130, as the presence of conductive metal features atop insulating layer 110 cause variations in the height of solder mask 140. Therefore, the solder mask 140 also defines channels at its top surface, located between the portions of solder mask 140 that cover the traces. In particular, when attaching a semiconductor die, channels in the solder mask may provide for the escape of air to edges of the die. Since the channels formed in solder mask 140 follow a pattern according to the shapes and construction of the channels formed between both signal traces 120 and dummy traces 130, the air can escape without being trapped during the adhesion step for the semiconductor die just as in the examples described above without solder mask 140. Since solder mask 140 has a nearly flat surface overall, the solder mask provides a very uniform and stable mounting surface atop which stacking of a semiconductor die can be performed. Also, it is preferred that the area at which the solder mask 140 and insulating layer 110 are in direct contact with each other is between 40% and 60% of the entire area for which the solder mask 140 and insulating layer 110 are separated by conductive features (e.g, signal traces 120 and dummy traces 13). Generally, it is preferred that the overall area of signal traces 120 (including vias), dummy traces 130 and solid regions 135 formed on insulating layer 110 occupies approximately 50% of the entire area of insulating layer 110. According to the above conditions, a sufficient adhesive force between the solder mask and insulating layer 110 can be assured.

Figure 9:
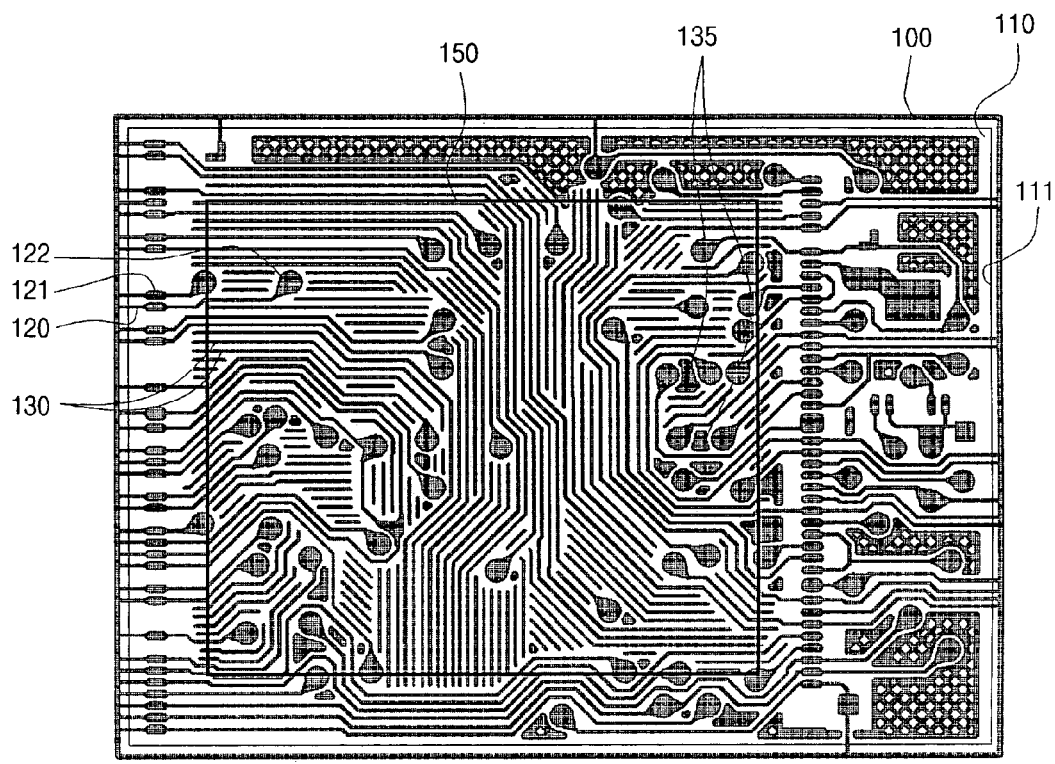
FIG. 9 is a plan view illustrating a semiconductor package according to an embodiment of the present invention.

FIG. 9 is a plan view illustrating a semiconductor die placement (semiconductor die mounting area) on a substrate according to an embodiment of the present invention. Reference numeral 150 denotes an outline of a semiconductor die, which is attached to substrate 100 by an adhesive film (not shown) that is applied to the lower surface of the semiconductor die. Semiconductor die has a size small enough to allow semiconductor die to fit within the plurality of bond fingers 121 formed on substrate 100, so that bond fingers 121 are exposed after die mounting. Signal traces 120 and dummy traces 130 have the same width and the same spacing between them, as described above. Further, as described above, the channels formed between the traces are oriented to extend substantially toward the edge of the substrate 100, so that the air between the adhesive film and the solder mask can easily escape during attachment of the semiconductor die 150. Thus, the formation of interfacial voids between the adhesive film and the solder mask is minimized to prevent de-lamination of the die from substrate 100 during subsequent thermal processing steps.

Figure 10:
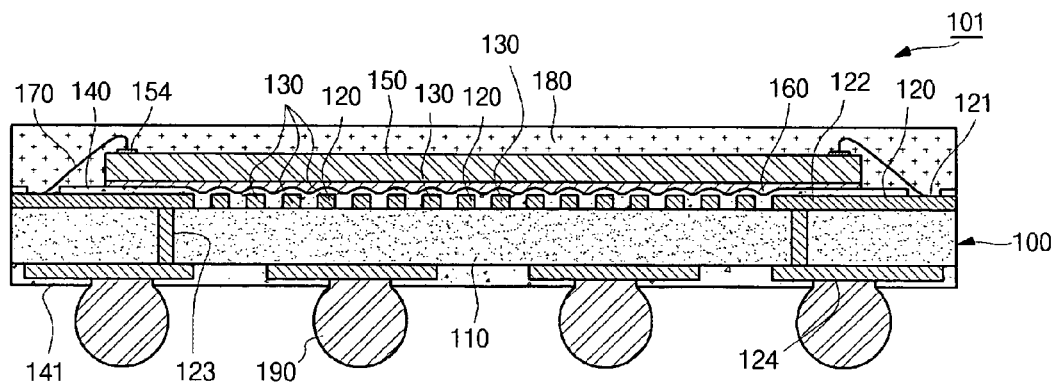
FIG. 10 is a cross section view of a semiconductor package according to an embodiment of the present invention.

FIG. 10 is a cross section view of a semiconductor package according to an embodiment of the present invention. As shown, a semiconductor package 101 according to an embodiment of the present invention includes a substrate 100, a semiconductor die 150, an adhesive film 160, a conductive wire 170, an encapsulant 180, and a solder ball 190. Substrate 100 includes at least one signal trace 120 and at least one dummy trace 130 formed on the surface of insulating layer 110, but in practice the number of signal traces 120 and dummy traces will be on the order of 100 or more. Signal trace includes bond finger 121 and a via pad 122. Dummy traces 130 are formed between signal traces 120. Signal traces 120 and dummy traces 130 may be formed to have the same width and the same spacing between them. Specifically, signal traces 120 and dummy traces 130 may have a width having a value between 40 and 80 um. Further, both the spacing between a signal trace 120 and a dummy trace 130 most adjacent to signal trace 120 and the spacing between a dummy trace 130 and another dummy trace 130 most adjacent to dummy trace 130 may be a same value between 40 and 80 um. Bond finger 121 of signal trace 120 is exposed to the upper exterior of solder mask 140. Via pad 122 of signal trace 120 may be connected to ball land 124 of the bottom surface of insulating layer 110 through conductive via 123. Ball land 124 is not coated with solder mask 141 so that a solder ball can be later re-flow soldered onto ball land 124. Dummy trace 130 may also include a via pad (not shown). Solder mask 140 formed over signal trace 120 and dummy trace 130 has a wave-like sectional shape in detailed view due to the thickness of signal trace 120 and dummy trace 130. However, solder mask 140 has a substantially flat surface overall.

Semiconductor die 150 with a plurality of bond pads 154 formed on the upper surface thereof is located on the substrate 100. Semiconductor die 150 is located on solder mask 140 where solder mask covers the plurality of signal traces 120 and the plurality of dummy traces 130. An adhesive film 160 is located between the lower surface of the semiconductor die 150 and the substantially flat solder mask 140, so as to attach and fix the semiconductor die 150 to substrate 100. In microscopic view, a plurality of channels are formed in the surface of solder mask 140 above signal traces 120 and dummy traces 130, so as to allow for the escape of air, thereby inhibiting formation of interfacial voids between adhesive film 160 and solder mask 140.

After die mounting, bond pads 154 of semiconductor die 150 are electrically connected through by conductive wire 170 to the bond fingers 121 of signal traces 120 that are exposed through solder mask 140. Conductive wire 170 may be formed of usual gold wire, aluminum wire or their equivalents, but the materials of conductive wire 170 are not limitations of the present invention. Next, semiconductor die 150 and conductive wire 170 are encapsulated by an encapsulant 180, to protect them from the external environment. Finally, solder balls 190 are fused to ball lands 124 exposed through the bottom surface of insulating layer 110 of the substrate 100. Solder balls 190 serve as terminals that enable mounting of substrate 100 on an external device or circuit board.

In the semiconductor package described above, semiconductor die 150 is attached onto a substantially flat substrate 100 having a plurality of signal traces 120 and a plurality of dummy traces 130 by an adhesive film 160. The bonding line of the semiconductor die 150 can thereby be uniformly maintained. Moreover, since nearly no void is formed between the adhesive film 160 and the solder mask 140, adhesive film 160 has a superior adhesion strength in the application.

Figure 11:
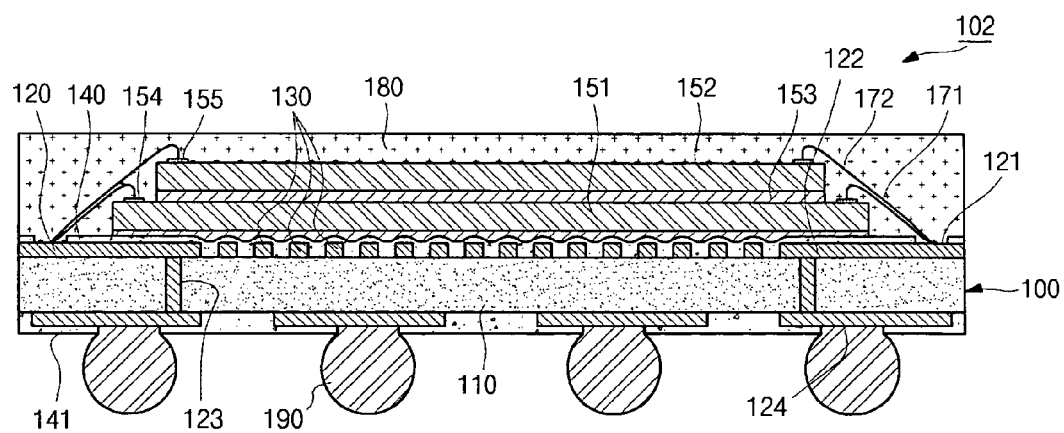
FIG. 11 is a cross section view of another semiconductor package according to another embodiment of the present invention.

FIG. 11 is a cross section view of a semiconductor package 102 according to another embodiment of the present invention. In semiconductor package 102, a first semiconductor die 151 is attached to substrate 100 according to the above descriptions. Since the mounting of semiconductor die 151 is very stable and co-planar with insulating layer 100, another semiconductor die 152 can easily be stacked onto first semiconductor die 151. Semiconductor die 152 is attached to the lower semiconductor die 151 by means of adhesive paste or an adhesive film 160. At least one additional semiconductor die 152 can be stacked on first semiconductor die 151, because first semiconductor die 151 provides a flat and stable mounting surface.

Figure 12:
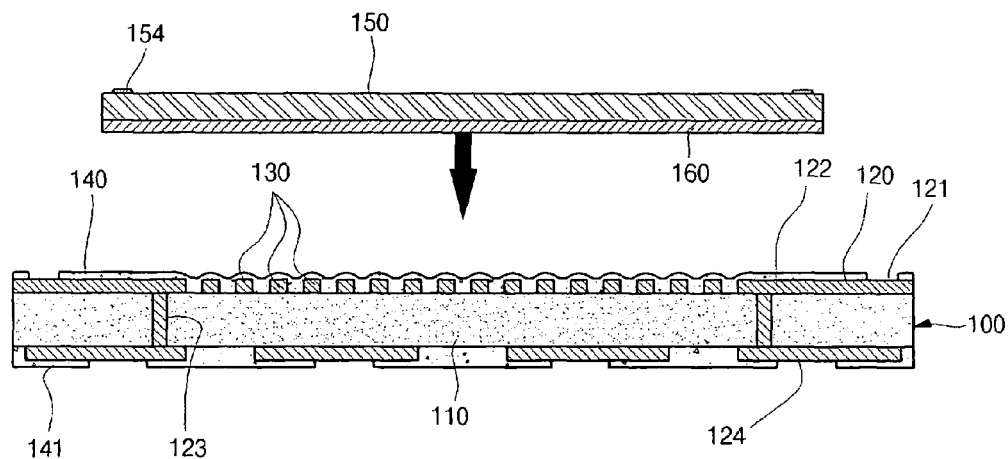
FIG. 12 is a cross section view illustrating attachment of a semiconductor die to a substrate by a method according to an embodiment of the present invention.

FIG. 12 is a cross sectional view illustrating attachment of a semiconductor die to a substrate according to an embodiment of the present invention. As shown, the semiconductor die 150 with an adhesive film 160 applied, on the lower surface of the semiconductor die 150 is attached to the upper surface of the substrate 100. Substrate 100 has signal traces 120 and dummy traces 130 having a predetermined width and a predetermined spacing between them but has a substantially flat surface. Specifically, all of signal traces 120 and dummy traces 130 are formed to have the same width and the same spacing between them and the channels formed between them are preferably oriented toward the edge from the center, so that the air can escape out from under semiconductor die 150 through the channels during attachment of semiconductor die 150 to substrate 100. Therefore, after the adhesion of the semiconductor die 150, a minimal number/size of voids are formed between adhesive film 160 and substrate 100. Also, the bonding line of the semiconductor die 150 is very uniformly maintained. In other words, the semiconductor die 150 is attached in a highly flat state while securing a wide adhesion area.

Figure 13:
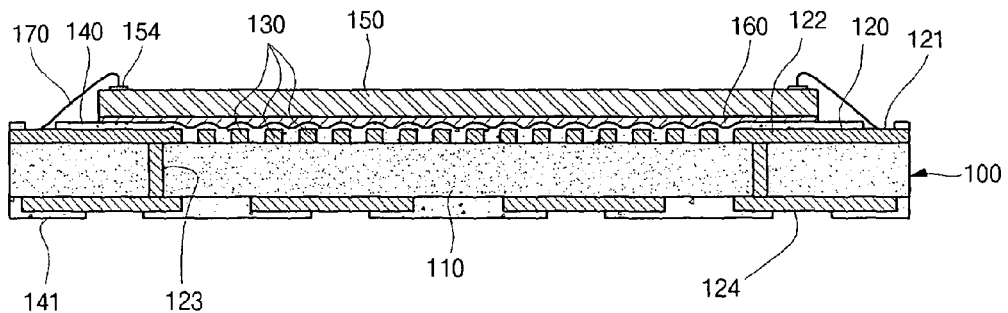
FIG. 13 is a cross section view illustrating wire-bonding between a semiconductor die and a substrate according to an embodiment of the present invention.

FIG. 13 is a sectional view illustrating wire-bonding between a semiconductor die 150 and a substrate 100 according to an embodiment of the present invention. As shown, a bonding pad 154 formed at the periphery of semiconductor die 150 is connected through a wire 170 to a bond finger 121 formed at signal trace 120 of the substrate. Wire 170 may be formed of usual gold wire, aluminum wire or their equivalents, and the material of conductive wire 170 is not a limitation of the present invention.

Figure 14:
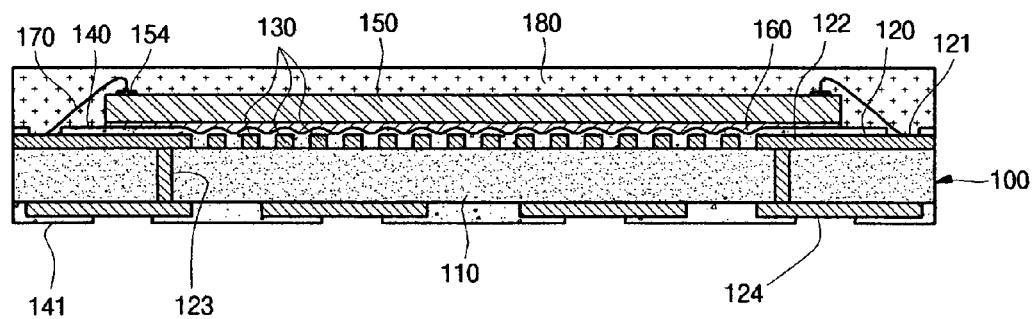
FIG. 14 is a cross section view illustrating encapsulation of an upper portion of a substrate according to an embodiment of the present invention.

FIG. 14 is a sectional view illustrating encapsulation of an upper portion of a substrate according to an embodiment of the present invention. As shown, both semiconductor die 150 and conductive wire 170 on substrate 100 are encapsulated by an encapsulant 180, so that semiconductor die 150 and conductive wire 170 are protected from the external environment.

Figure 15:
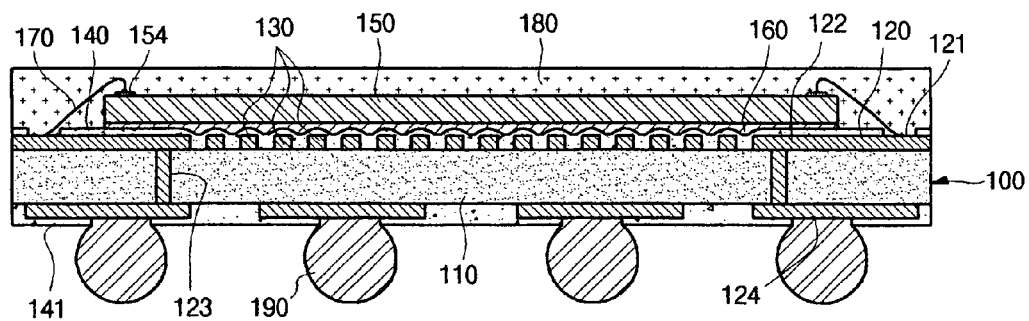
FIG. 15 is a cross section view illustrating fusion of solder balls to lower portions of a substrate according to an embodiment of the present invention.

FIG. 15 is a sectional view illustrating fusion of solder balls to lower portions of a substrate according to an embodiment of the present invention. As shown, solder balls 190 are fused to a ball land 124 exposed through insulating layer 110 of the substrate 100. Semiconductor package 100 is manufactured through the above-described steps and is then mounted to an external device. Further, a minimal size/number of voids are formed between adhesive film 160 and substrate 100, thereby minimizing the chance of de-lamination caused by heat generated in the step of mounting the semiconductor package 100 to an external device or heat generated by the operation of semiconductor die 150.

It is contemplated that the present invention can be applied to circuit substrates having more than one conductive layer. In such a circuit, dummy traces 130 will occupy the layer(s) of the substrate to which at least one semiconductor die is attached. Additionally, solder balls are connected to the conductive layers by means of conductive vias provided through insulating layer(s).

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A substrate for mounting a semiconductor die, comprising:
    a substantially planar insulating layer comprising a side edge;
    a conductive metal pattern formed on a top side of the insulating layer including signal traces terminating in bond fingers outside of a die mounting area, the bond fingers having a width greater than a width of the signal traces, wherein at least some of the signal traces extend within the die mounting area, and further including a plurality of electrically isolated dummy traces disposed between the signal traces in otherwise empty regions defined by at least some of the signal traces within the die mounting area, thereby filling the otherwise empty regions with a fill pattern that improves planarity of an upper surface of the die mounting area, wherein the dummy traces have substantially the same width as the signal traces and extend from within the die mounting area to the side edge of the insulating layer; and
    a solder mask coating disposed over the insulating layer and the conductive metal pattern exclusive of the bond fingers, whereby the dummy traces and signal traces provide corresponding variations in an upper surface of the solder mask coating such that a plurality of channels are formed in the solder mask coating, the plurality of channels extending from within the die mounting area to the side edge of the insulating layer, the plurality of channels allowing for the escape of air toward the side edge of the insulating layer during attachment of the semiconductor die.

2. The substrate of claim 1, wherein the upper surface of the die mounting area is the upper surface of the solder mask coating.

3. The substrate of claim 1, wherein an inter-conductor spacing is a required minimum spacing between signal traces as specified by design rules, the dummy traces having substantially the same inter-conductor spacing as the signal traces.

4. The substrate of claim 3, wherein the ends of the dummy traces terminate at a distance from a signal trace defining an edge of one of the otherwise empty regions, the distance substantially equal to the inter-conductor spacing.

5. The substrate of claim 1, wherein the dummy traces are controlled according to the same design rules applied to the signal traces.

6. The substrate of claim 1, wherein the dummy traces are controlled according to the same design rules applied to the signal traces, excepting that adjacent dummy traces of less than a threshold length are merged into a continuous metal region.

7. The substrate of claim 6, wherein the threshold length is equal to five times a minimum design width of the signal traces and dummy traces.

8. The substrate of claim 1, wherein within one of the otherwise empty regions, a dummy trace located at an edge of the otherwise empty region follows a contour defined by the edge of the otherwise empty region.

9. The substrate of claim 1, wherein a portion of a boundary of at least one of the otherwise empty regions is defined by the edge of a via, and wherein the dummy traces in the vicinity of the via terminate to maintain a distance from the via equal to an inter-conductor spacing of the signal traces.

10. A semiconductor package, comprising:
    a substantially planar insulating layer having a side edge;
    a conductive metal pattern formed on a top side of the insulating layer including signal traces terminating in bond fingers outside of a die mounting area, the bond fingers having a width greater than a width of the signal traces, wherein at least some of the signal traces extend within the die mounting area, and further including a plurality of electrically isolated dummy traces extending along a substantially linear path, the dummy traces disposed in otherwise empty regions between and defined by at least some of the signal traces within the die mounting area, thereby filling the otherwise empty regions with a fill pattern that improves planarity of an upper surface of the die mounting area, wherein the dummy traces have substantially the same width as the signal traces and extend from within the die mounting area to the side edge of the insulating layer;
    an adhesive film having a bottom side applied over the top side of the insulating layer and substantially covering the die mounting area;
    a semiconductor die attached to a top side of the adhesive film; and
    a solder mask coating disposed over the insulating layer and the conductive metal pattern exclusive of the bond fingers, whereby the dummy traces and signal traces provide corresponding variations in an upper surface of the solder mask coating such that a plurality of channels are formed in the solder mask coating, the plurality of channels extending from within the die mounting area to the side edge of the insulating layer, the plurality of channels allowing for the escape of air toward the side edge of the insulating layer between the solder mask coating and the adhesive film during attachment of the semiconductor die.

11. The semiconductor package of claim 10, wherein the upper surface of the die mounting area is the upper surface of the solder mask coating, and wherein the adhesive film is attached to the upper surface of the solder mask coating.

12. The semiconductor package of claim 11, wherein the dummy traces are controlled according to the same design rules applied to the signal traces.

13. The semiconductor package of claim 11, wherein the dummy traces are controlled according to the same design rules applied to the signal traces, excepting that adjacent dummy traces of less than a threshold length are merged into a continuous metal region.

14. The semiconductor package of claim 13, wherein the threshold length is equal to five times a minimum design width of the signal traces and dummy traces.

15. A semiconductor package, comprising:
- a substantially planar insulating layer comprising a side edge;
- a conductive metal pattern formed on a top side of the insulating layer including signal traces terminating in bond fingers outside of a die mounting area, the bond fingers having a width greater than a width of the signal traces, wherein at least some of the signal traces extend within the die mounting area, and further including a plurality of electrically isolated dummy traces extending along a substantially linear path, the dummy traces disposed in otherwise empty regions between and defined by at least some of the signal traces within the die mounting area, thereby filling the otherwise empty regions with a fill pattern that improves planarity of an upper surface of the die mounting area, wherein the dummy traces have substantially the same width as the signal traces and extend from within the die mounting area to the side edge of the insulating layer;
- a solder mask coating disposed over the insulating layer and the conductive metal pattern exclusive of the bond fingers, whereby the dummy traces and signal traces provide corresponding variations in an upper surface of the solder mask coating and the upper surface of the die mounting area is the upper surface of the solder mask coating;
- an adhesive film having a bottom side attached to the upper surface of the solder mask coating and substantially covering the die mounting area; and
- a semiconductor die attached to a top side of the adhesive film, wherein a plurality of channels are formed between the signal traces and the dummy traces, a pattern of a plurality of channels of the solder mask coating following a pattern of the plurality of channels formed between the signal traces and the dummy traces, the plurality of channels of the solder mask coating extending from within the die mounting area to the side edge of the insulating layer allowing for the escape of air toward the side edge of the insulating layer between the solder mask coating and the adhesive film.

* * * * *